(12) United States Patent
Jeong et al.

(10) Patent No.: US 7,508,730 B2
(45) Date of Patent: Mar. 24, 2009

(54) SEMICONDUCTOR MEMORY DEVICES HAVING CONTROL CIRCUITRY TO AVOID RECOVERING A CHARGE PUMP WHEN EXECUTING CONSECUTIVE SECTIONS OF A CONTINUOUS OPERATION COMMAND AND METHODS OF OPERATING THE SAME

(75) Inventors: Yong-Taek Jeong, Daegu (KR);
Sang-Chul Kang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 26 days.

(21) Appl. No.: 11/565,016

(22) Filed: Nov. 30, 2006

(65) Prior Publication Data
US 2008/0084779 A1    Apr. 10, 2008

(30) Foreign Application Priority Data
Oct. 2, 2006    (KR) ............... 10-2006-0097194

(51) Int. Cl.
*G11C 8/00*    (2006.01)
(52) U.S. Cl. .................. 365/230.06; 365/189.09; 365/189.04; 365/185.18; 365/227
(58) Field of Classification Search ........... 365/189.04, 365/185.18, 227, 230.06, 189.09
See application file for complete search history.

(56) References Cited
U.S. PATENT DOCUMENTS
6,335,881 B2    1/2002    Kim et al.
6,680,868 B2    1/2004    Akamatsu
6,930,952 B2    8/2005    Kim

FOREIGN PATENT DOCUMENTS
| JP | 2001-229684 | 8/2001 |
|----|-------------|--------|
| JP | 2002-230985 | 8/2002 |
| KR | 10-2001-0081243 | 8/2001 |
| KR | 10-2004-0103011 | 12/2004 |

*Primary Examiner*—Hoai V Ho
*Assistant Examiner*—Fernando N Hidalgo
(74) *Attorney, Agent, or Firm*—Myers Bigel Sibley & Sajovec, P.A.

(57) ABSTRACT

A semiconductor device includes a memory cell array and a command interface that is configured to receive a command from outside of the semiconductor memory device. The command interface is further configured to interpret the received command and to determine if the received command is a continuous operation command. The command interface outputs a command signal corresponding to the command and at least one flag signal that indicates a continuous operation section if the command is a continuous operation command. A control unit is configured to receive the command signal and the at least one flag signal output from the command interface, and to generate a pump control signal based on the received command signal and the at least one flag signal. A charge pump is configured to generate a voltage in response to the pump control signal for use in accessing the memory cell array to read write and/or erase data.

11 Claims, 5 Drawing Sheets

SEMICONDUCTOR MEMORY DEVICES HAVING CONTROL CIRCUITRY TO AVOID RECOVERING A CHARGE PUMP WHEN EXECUTING CONSECUTIVE SECTIONS OF A CONTINUOUS OPERATION COMMAND AND METHODS OF OPERATING THE SAME

CROSS-REFERENCE TO RELATED PATENT APPLICATION

This application claims the benefit of and priority to Korean Patent Application No. 10-2006-0097194, filed Oct. 2, 2006, in the Korean Intellectual Property Office, the disclosure of which is hereby incorporated herein by reference as if set forth in its entirety.

BACKGROUND OF THE INVENTION

1. Field of the Invention

The present invention relates to semiconductor memory devices, and, more particularly, to non-volatile semiconductor memory devices that can drive a charge pump and methods of controlling the charge pump.

2. Description of the Related Art

Semiconductor memory devices include volatile semiconductor memory devices and non-volatile semiconductor memory devices. The volatile semiconductor memory devices include dynamic random access memories and static random access memories. Volatile semiconductor memory devices may be featured with a fast reading and writing speed, but may lose stored content when the external power supply is removed or lost. Non-volatile semiconductor memory devices include a mask read-only memory (MROM), a programmable read-only memory (PROM), an erasable programmable read-only memory (EPROM), and an electrically erasable programmable read-only memory (EEPROM). A non-volatile semiconductor memory device keeps its content even when the external power supply is removed or lost. Thus, a non-volatile semiconductor memory device may be used to store content that must be kept regardless of whether power is supplied or not.

However, an MROM, PROM, and/or EPROM may not be easy for users to update the content of the memory because erasing and writing may not be freely done by a system. By contrast, an EEPROM is able to electrically erase and write so as to be increasingly applied to system programming or auxiliary memory devices, which require continuous update. In particular, a flash EEPROM (hereinafter, referred to as flash memory device) may be advantageous in a high capacity auxiliary memory device application because of its high integration compared to a conventional EEPROM. Of the flash memory devices, a NAND type flash memory may exhibit a high integration compared to other NOR or AND type flash memory devices.

The flash memory device programs or erases data with respect to a cell transistor using an F-N (Fowler-Nordheim) tunneling mechanism, which uses a higher voltage, for example, 20V, than the power voltage. Also, when a reading operation is performed, a voltage of about 5V-8V may be used, although it is lower than the high voltage of about 20V used in programming or erase operations.

Figure 1:
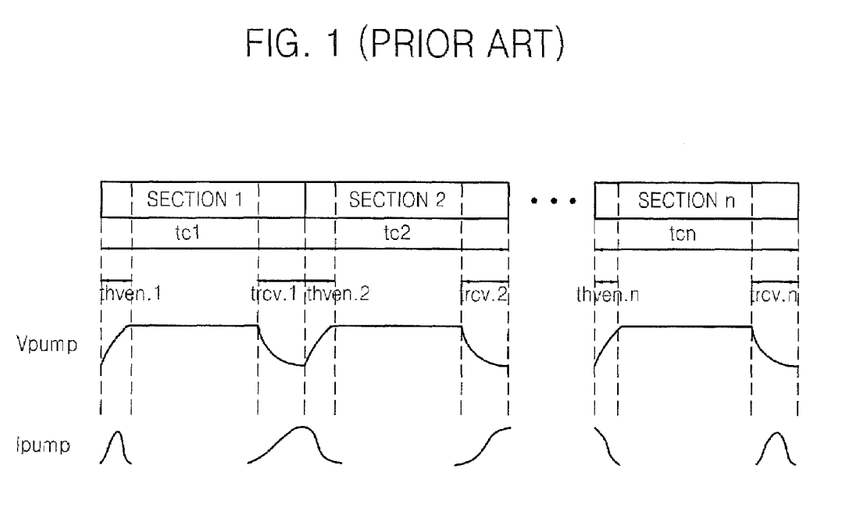
FIG. 1 is a timing diagram that illustrates a charge pump driving method for a conventional semiconductor memory device.

To obtain the above high voltage for programming/erase operations or the voltage used for the reading operation, the flash memory device is equipped with a high voltage generation circuit. The high voltage generation circuit is typically embodied by using a charge pump. FIG. 1 is a timing diagram that illustrates a charge pump driving method of a conventional semiconductor memory device. Referring to FIG. 1, the flash memory device includes, for each operation section (tc1-tcn), a pumping section (thven.1-thven.n) in which a charge pump (not shown) is pumped to obtain a necessary voltage, a section in which an actual operation is performed using the voltage obtained through the pumping operation during the pumping section (thven.1-thven.n), and a recovery section (trcv.1-trcv.n) in which the charge pump is recovered.

However, the conventional charge pump driving method as shown in FIG. 1 may be inefficient when a continuous operation is performed in the continuous operation sections. For example, assuming that a section 1 (tc1) and a section 2 (tc2) are a section in which a program operation is performed, because the charge pump is pumped by the same voltage after the charge pump is recovered after the program operation in section 1 (tc1) is complete, unnecessary recovery and pumping operations are performed. Also, as shown in FIG. 1, because current is consumed during the pumping or recovery of the charge pump, the conventional charge pump driving method may cause unnecessary current consumption.

SUMMARY

According to some embodiments of the present invention, a semiconductor device includes a memory cell array and a command interface that is configured to receive a command from outside of the semiconductor memory device. The command interface is further configured to interpret the received command and to determine if the received command is a continuous operation command. The command interface outputs a command signal corresponding to the command and at least one flag signal that indicates a continuous operation section if the command is a continuous operation command. A control unit is configured to receive the command signal and the at least one flag signal output from the command interface, and to generate a pump control signal based on the received command signal and the at least one flag signal. A charge pump is configured to generate a voltage in response to the pump control signal for use in accessing the memory cell array to read write and/or erase data.

In other embodiments, the command interface includes a command decoder that is configured to receive the command, to interpret this received command, and to output the command signal corresponding to the command to the control unit. A flag signal generation unit is configured to receive the command interpreted by the command decoder and to output to the control unit the at least one flag signal that indicates whether the command is a continuous operation command and indicates a continuous operation section if the command is a continuous operation command.

In still other embodiments, the flag signal generation unit includes a command register that is configured to receive and to store the command signal. A continuous operation command storing unit is configured to store information on the continuous operation commands. A comparison unit is configured to search the information on the continuous operation commands stored in the continuous operation command storing unit for a command signal stored in the command register and to generate the at least one flag signal based on a search result.

In still other embodiments, the flag signal generation unit is configured to generate a first flag signal having a first logic level when a first operation section of the continuous operation command starts.

In still other embodiments, the flag signal generation unit is further configured to generate a second flag signal having a first logic level when a last operation section of the continuous operation command starts.

In still other embodiments, the control unit in response to the second flag signal is configured to output a recovery signal to recover the charge pump to the charge pump.

In still other embodiments, the continuous operation command includes at least one of a cache red, a cache program, and a burst mode command.

In still other embodiments, the semiconductor device is a flash memory.

In further embodiments of the present invention, a charge pump of a semiconductor memory device is controlled by receiving a command from outside of the semiconductor memory device, interpreting the received command to determine if the received command is a continuous operation command, generating a command signal corresponding to the command and at least one flag signal indicating a continuous operation section if the command is a continuous operation command, generating a pump control signal responsive to the command signal and the at least one flag signal, and generating a voltage responsive to the pump control signal for accessing a memory cell array to read, write, and/or erase data.

In still further embodiments, generating the at least one flag signal includes searching information on continuous operation commands stored in a continuous operation command storing unit for the command signal, and generating the at least one flag signal based on a search result.

In still further embodiments, generating the at least one flag signal includes generating a first flag having a first logic level when a first operation section of the continuous operation command starts.

In still further embodiments, generating the at least one flag signal further includes generating a second flag signal having the first logic level when a last operation section of the continuous operation command starts.

In still further embodiments, generating the pump control signal responsive to the at least one flag signal includes generating the pump control signal to recover the charge pump in response to the second flag signal.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS OF THE INVENTION

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
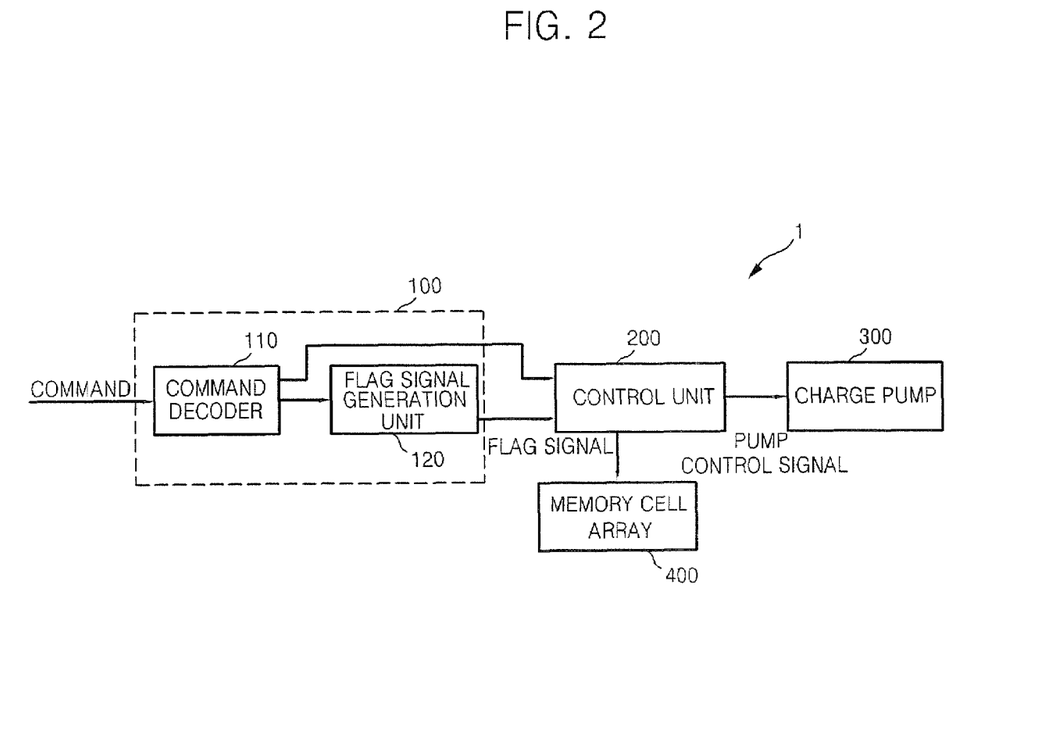
FIG. 2 is a block diagram of a semiconductor memory device according to some embodiments of the present invention.

FIG. 2 is a block diagram of a semiconductor memory device according to some embodiments of the present invention. A semiconductor memory device 1 includes a command interface 100, a control unit 200, a charge pump 300, and a memory cell array 400. The command interface 100 receives an input command from the outside of the semiconductor memory device 1, for example, a host, interprets the received command, and outputs a command signal corresponding to the command and at least one flag signal indicating a continuous operation section according to whether the command is a continuous operation command or not.

The command interface 100 may include a command decoder 110 and a flag signal generation unit 120. The command decoder 110 receives the command, interprets the received command, and outputs a command signal corresponding to the command to the control unit 200. The flag signal generation unit 120 receives the command interpreted by the command decoder and outputs at least one flag signal indicating whether the command is a continuous operation command associated with a continuous operation section to the control unit 200.

That is, the command decoder 110 receives the command output from the outside of the semiconductor memory device 1, for example, a host, and outputs a command signal corresponding to the command to the control unit 200 to perform an operation corresponding to the command. Also, the flag signal generation unit 120 determines whether the received command is a continuous operation command and, if so, outputs a flag signal indicating that the received command is a continuous operation command to the control unit 200.

Figure 4:
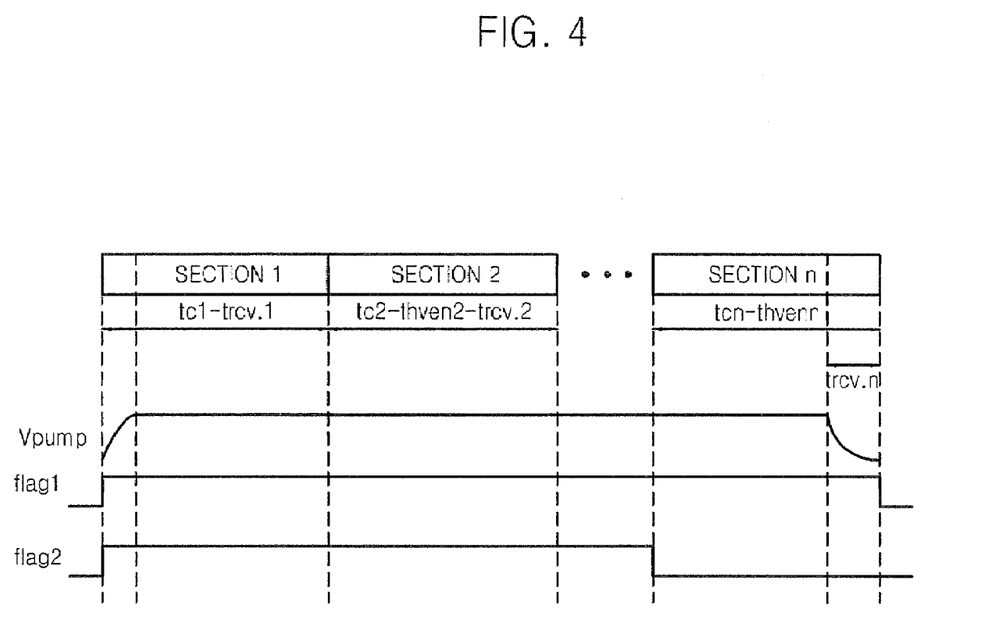
FIG. 4 is a timing diagram that illustrates a charge pump driving method based on a flag signal according to some embodiments of the present invention.

The continuous operation command refers to a command to perform the same operation, for example, read, program, or erase, in at least two or more continuous operation sections. That is, as shown in FIG. 4, when the operation in a section 1 is a read operation, the continuous operation command indicates that the operation in section 2-section n is the same read operation. Here, "n" is an integer that is 2 or higher.

For example, commands such as cache read or cache program or commands in a burst mode may be continuous operation commands. The commands having a cache function, such as the cache read or cache program command, may be continuous operation commands. The burst mode commands, for example, burst read or burst program, may be continuous operation commands because they repeat the same operation until a burst stop signal is input.

The cache function commands are described in detail in Korean Patent Publication No. 2003-33679 entitled "Nonvolatile semiconductor memory device having caches function and program, read, and copyback methods thereof," which is hereby incorporated herein by reference. The above-described commands are a mere example and a variety of command sets corresponding to the continuous operation command, according to the types or suppliers of the semiconductor memory devices, can be used therefor.

The flag signal generation unit 120 generates a flag signal when the command received from the outside of the semiconductor memory device 1 is a continuous operation command and outputs the generated flag signal to the control unit 200. The control unit 200 determines whether the charge pump 300 is to be recovered in the next operation section based on the received flag signal. That is, the control unit 200 does not recover the charge pump 300 based on the flag signal when an operation performed in the next operation section, for example, read, program, or erase, is the same as the operation that is presently performed.

Figure 3:
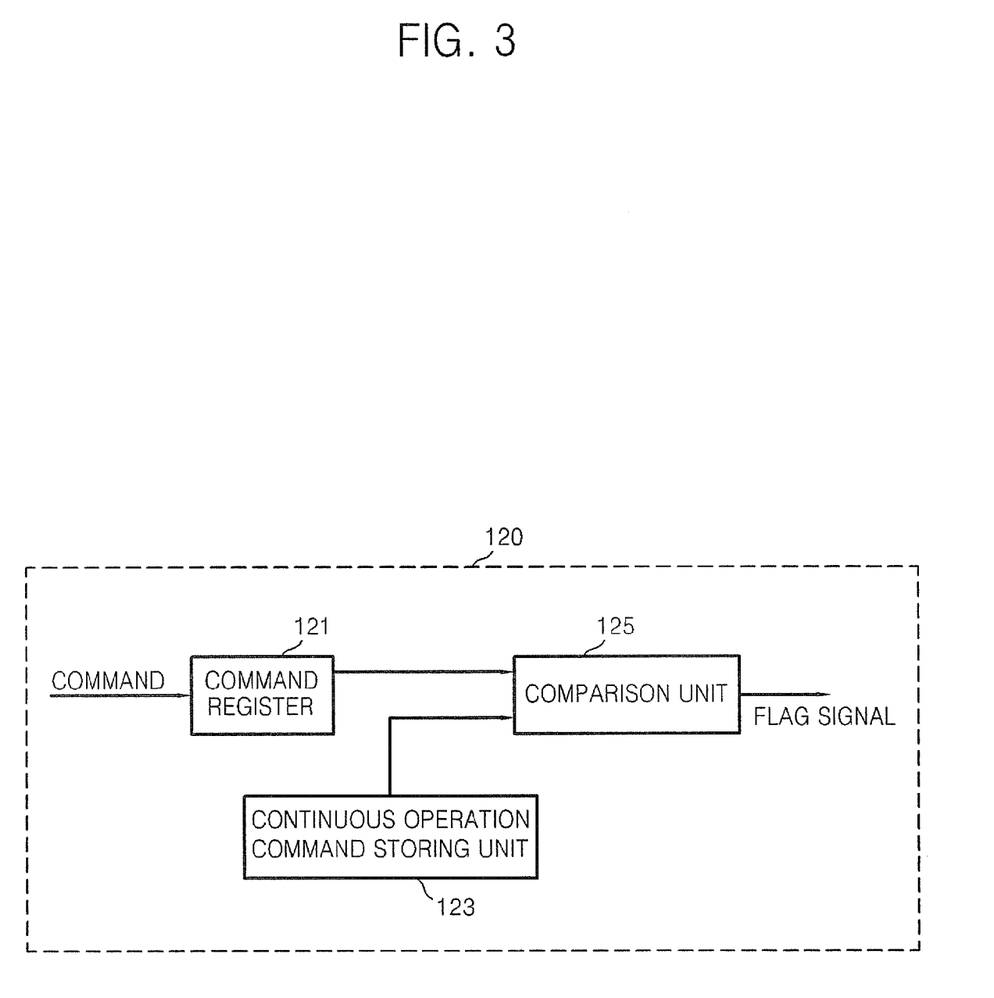
FIG. 3 is a block diagram of a flag signal generation unit according to some embodiments of the present invention.

FIG. 3 is a block diagram of a flag signal generation unit according to some embodiments of the present invention. Referring to FIGS. 2 and 3, the flag signal generation unit 120 includes a command register 121, a continuous operation command storing unit 123, and a comparison unit 125. The command register 121 receives a command signal output from the command decoder 110 and stores the received command signal.

The continuous operation command storing unit 123 may store information on all continuous operation commands performed in the semiconductor memory device 1. The continuous operation command storing unit 123 can be embodied by a storage device, for example, a ROM or flash memory, or by a combinational logic. Also, the continuous operation command storing unit 123 stores not only information on each of the continuous operation commands, for example, a command code, but also the nature of each continuous operation command, for example, whether it is a command code corresponding to a start command of the continuous operation command or a command code corresponding to the last command. The command sets corresponding to the continuous operation commands may vary according to the types or suppliers of the semiconductor memory devices as described above.

The comparison unit 125 searches the information on the continuous operation commands stored in the continuous operation command storing unit 123 for the command signal stored in the command register 121 and generates at least one flag signal based on the result of search. For example, when the command signal is a command corresponding to a cache read, for example, 000Eh, the command signal 000Eh is stored in the command register 121. The comparison unit 125 searches the information on the continuous commands stored in the continuous operation command storing unit 123 for the command signal 000Eh stored in the command register 121. The command signal 000Eh is searched in the continuous operation command storing unit 123 and, because the command signal 000Eh is not the last continuous operation command, the comparison unit 125 generates a first flag signal.

When the command signal is a command corresponding to the last cache read, for example, 000Ch, the command signal 000Ch is stored in the command register 121. The comparison unit 125 searches the information on the continuous operation commands stored in the continuous operation command storing unit 123 for the command signal 000Ch stored in the command register 121. From a search result, the command signal 000Ch is a continuous operation command and, because the information in the continuous operation command storing unit 123 indicates that the command signal is a last continuous operation command, the comparison unit 125 generates a second flag signal.

FIG. 4 is a timing diagram that illustrates a charge pump driving method based on a flag signal according to some embodiments of the present invention. Referring to FIGS. 2 and 4, it can be seen that an unnecessary charge pump recovery operation can be omitted in the continuous operation section based on a flag signal generated by the flag signal generation unit 120. That is, comparing FIGS. 1 and 4, because the recovery section and pumping section, for example, trcv.1, thven.2, and trcv.2, are omitted in each operation section, current (Ipump) consumption may be reduced accordingly. Also, compared to the time tc2 in section 2 of FIG. 1, because the pumping section and recovery section are not needed in section 2, the operation in section 2 is performed only for a time of tc2-thven.2-trcv.2 so that the command processing speed may increase.

According to some embodiments of the present invention, the flag signal generation unit 120 generates a first flag signal (flag1) having a first logic level when the first operation section of a continuous operation command starts. The flag signal generation unit 120 generates the first flag signal (flag1) having a first logic level, for example, "high," when the first operation section, for example, section 1 of a continuous operation command, for example, cache read, and outputs the first flag signal (flag1) to the control unit 200.

Figure 5:
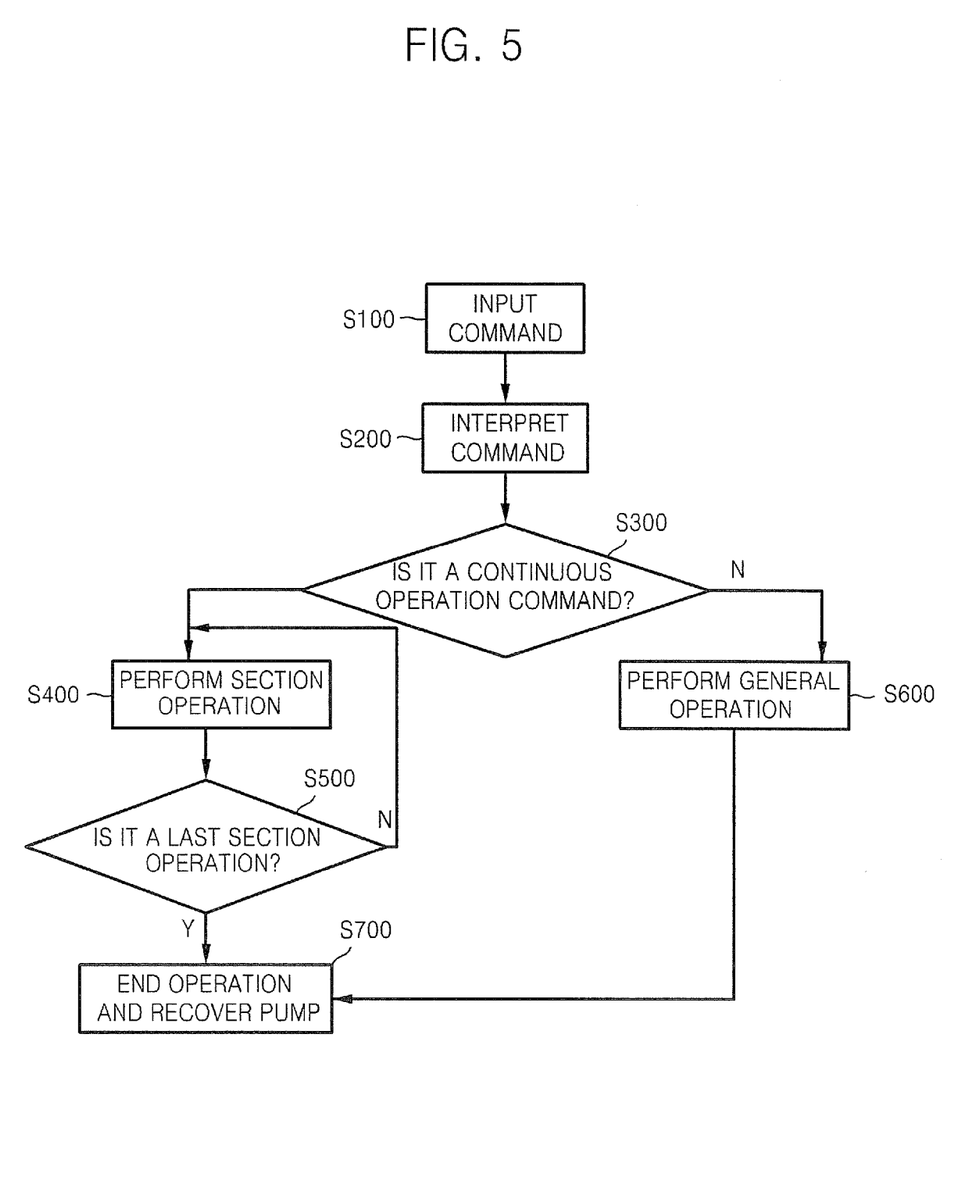
FIG. 5 is a flow chart illustrating operations for executing a continuous operation command according to some embodiments of the present invention.

The first flag signal (flag1), as shown in FIG. 5, may be a signal that is maintained until the last operation section by transitioning to the first logic level at the start point of the first operation section of the continuous command. Also, the flag signal generation unit 120 may further generate a second flag signal (flag2) having a first logic level when the last operation section of the continuous operation command starts. The control unit 200 does not recover the charge pump 300 in the next operation section when the first flag signal (flag1) is the first logic level, for example, "high".

Because the flag signal generation unit 120 receives the same command signal as the continuous operation command, for example, cache read, for each operation section until the last section (section n) is performed, the flag signal generation unit 120 may not generate a flag signal any longer. The flag signal generation unit 120 repeatedly generates a signal having the same first logic level as the first flag signal flag1 and outputs the control unit 200.

When the last section (section n) is performed, the flag signal generation unit 120 receives a command signal indicating the last section of the continuous operation command, for example, cache read. When receiving the command signal, the flag signal generation unit 120 generates the second flag signal (flag2) and outputs the generated second flag signal flag2 to the control unit 200. The control unit 200 upon receiving the second flag signal (flag2) outputs a pump control signal to recover the charge pump 300 to the charge pump 300 when the operation section that is presently performed by the control unit 200 ends.

Referring back to FIG. 2, the control unit 200 receives the command signal and the flag signal output from the command interface 100 and generates the pump control signal based on the received command signal and flag signal. For example, when the command received from the outside of the semiconductor memory device 1 is a command to continuously perform program operations, the control unit 200 receives from the command interface 100 a command signal to perform a program in an operation section and a first flag signal indicating that the command is a continuous operation command. Also, the control unit 200 generates the pump control signal to pump the charge pump 300 as much as needed to perform the program operation based on the command signal and the first flag signal. The charge pump 300 in response to the pump control signal generates a voltage needed to read data from the memory cell array 400 or write or erase data with respect to the memory cell array 400.

FIG. 5 is a flow chart that illustrates operations for executing a continuous operation command according to some embodiments of the present invention. Referring to FIGS. 2 and 5, the command decoder 110 receives a command from the outside of the semiconductor memory device 1, for example, a host (S100). The command decoder 110 interprets the received command and outputs a command signal corresponding to the command to the control unit 200 (S200).

The flag signal generation unit 120 determines whether the command is a continuous operation command based on the command signal (S300). When the command is determined to be a continuous operation command, the flag signal generation unit 120 generates a first flag signal and outputs the generated first flag signal to the control unit 200. The control unit 200 does not recover the charge pump 300 and performs each of the section operations even when each section operation is complete while the first flag signal has a first logic level, for example, "high" (S400).

The control unit 200 performs each of the section operations until the second flag signal is received. When the second flag signal is received, the control unit 200 determines that it is the last section of the continuous operation section (S500). When the presently performed operation is completed, the control unit 200 recovers the charge pump 300 (S700). When the command is not a continuous operation command, that is, the flag signal generation unit 120 does not output the first flag signal to the control unit 200, the charge pump 300 is driven in a typical method (S600).

As described above, in a semiconductor memory device according to some embodiments of the present invention, when a continuous operation command is input, unnecessary current consumption may be reduced by more efficiently driving the charge pump. Also, by removing unnecessary pumping operations and recovery operations, the voltage pumped in the previous section is used so that operation speed is increased.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A semiconductor memory device comprising:
   a memory cell array;
   a command interface configured to receive a command from outside of the semiconductor memory device, to interpret the received command to determine if the received command is a continuous operation command, and to output a command signal corresponding to the command and at least one flag signal indicating a continuous operation section if the command is a continuous operation command, the command interface comprising:
   a command decoder configured to receive the command, to interpret the received command, and to output the command signal corresponding to the command to the control unit; and
   a flag signal generation unit configured to receive the command interpreted by the command decoder and to output to the control unit the at least one flag signal indicating whether the command is a continuous operation command and indicating a continuous operation section if the command is a continuous operation command;
   a control unit configured to receive the command signal and the at least one flag signal output from the command interface and to generate a pump control signal based on the received command signal and the at least one flag signal; and
   a charge pump configured to generate a voltage in response to the pump control signal for use in accessing the memory cell array to read, write, and/or erase data.

2. The semiconductor memory device of claim 1, wherein the flag signal generation unit comprises:
   a command register configured to receive and to store the command signal;
   a continuous operation command storing unit configured to store information on the continuous operation commands; and
   a comparison unit configured to search the information on the continuous operation commands stored in the continuous operation command storing unit for a command signal stored in the command register and to generate the at least one flag signal based on a search result.

3. The semiconductor memory device of claim 1, wherein the flag signal generation unit is configured to generate a first flag signal having a first logic level when a first operation section of the continuous operation command starts.

4. The semiconductor memory device of claim 3, wherein the flag signal generation unit is further configured to generate a second flag signal having a first logic level when a last operation section of the continuous operation command starts.

5. The semiconductor memory device of claim 4, wherein the control unit in response to the second flag signal is configured to output a recovery signal to recover the charge pump to the charge pump.

6. The semiconductor memory device of claim 1, wherein the continuous operation command comprises at least one of a cache read, a cache program, and a burst mode command.

7. The semiconductor memory device of claim 1, wherein the semiconductor memory device is a flash memory.

8. A method for controlling a charge pump of a semiconductor memory device, comprising:
   receiving a command from outside of the semiconductor memory device;
   interpreting the received command to determine if the received command is a continuous operation command;
   generating inside the semiconductor memory device a command signal corresponding to the command and at least one flag signal indicating a continuous operation section if the command is a continuous operation command;
   generating a pump control signal responsive to the command signal and the at least one flag signal; and
   generating a voltage responsive to the pump control signal for accessing a memory cell array to read, write, and/or erase data;
   wherein generating the at least one flag signal comprises:
   searching information on continuous operation commands stored in a continuous operation command storing unit for the command signal; and
   generating the at least one flag signal based on a search result.

9. The method of claim 8, wherein generating the at least one flag signal comprises generating a first flag having a first logic level when a first operation section of the continuous operation command starts.

10. The method of claim 9, wherein generating the at least one flag signal further comprises generating a second flag signal having the first logic level when a last operation section of the continuous operation command starts.

11. The method of claim 10, wherein generating the pump control signal responsive to the at least one flag signal comprises generating the pump control signal to recover the charge pump in response to the second flag signal.

* * * * *